(12) United States Patent
Haerle

(10) Patent No.: US 7,893,737 B2
(45) Date of Patent: Feb. 22, 2011

(54) CHARGE PUMP FOR PLL/DLL

(75) Inventor: Dieter Haerle, Villach (AT)

(73) Assignee: Mosaid Technologies Incorporated (CA)

( * ) Notice: Subject to any disclaimer, the term of this patent is extended or adjusted under 35 U.S.C. 154(b) by 0 days.

(21) Appl. No.: 12/714,670

(22) Filed: Mar. 1, 2010

(65) Prior Publication Data

US 2010/0213994 A1  Aug. 26, 2010

Related U.S. Application Data

(63) Continuation of application No. 12/317,877, filed on Dec. 30, 2008, now Pat. No. 7,692,461, which is a continuation of application No. 12/214,053, filed on Jun. 16, 2008, now Pat. No. 7,616,035, which is a continuation of application No. 11/636,876, filed on Dec. 11, 2006, now Pat. No. 7,408,391, which is a continuation of application No. 11/009,534, filed on Dec. 10, 2004, now Pat. No. 7,176,733.

(60) Provisional application No. 60/528,958, filed on Dec. 11, 2003.

(51) Int. Cl.
*H03L 7/06* (2006.01)

(52) U.S. Cl. .......................... 327/157; 327/148

(58) Field of Classification Search .................. 327/148, 327/157

See application file for complete search history.

(56) References Cited

U.S. PATENT DOCUMENTS

| | | | |
|---|---|---|---|
| 5,233,314 A | 8/1993 | McDermott et al. | |
| 5,362,990 A | 11/1994 | Alvarez et al. | |
| 5,404,250 A | 4/1995 | Hase et al. | |
| 5,473,283 A | 12/1995 | Luich | |
| 5,783,972 A | 7/1998 | Nishikawa | |
| 5,933,037 A | 8/1999 | Momtaz | |
| 5,945,855 A | 8/1999 | Momtaz | |
| 6,124,755 A | 9/2000 | Parker et al. | |
| 6,160,432 A | 12/2000 | Rhee et al. | |
| 6,163,184 A | 12/2000 | Larsson | |
| 6,229,362 B1 | 5/2001 | Choi | |
| 6,278,332 B1 | 8/2001 | Nelson et al. | |
| 6,316,987 B1 | 11/2001 | Dally et al. | |
| 6,512,404 B2 | 1/2003 | Ruegg et al. | |
| 6,535,051 B2 | 3/2003 | Kim | |

(Continued)

FOREIGN PATENT DOCUMENTS

EP   0 484 059 A2   5/1992

(Continued)

OTHER PUBLICATIONS

Duque-Carrillo, J.F., et al, "1-V Rail-to-Rail Operational Amplifiers in Standard CMOS Technology," *IEEE Journal of Solid-State Circuits*, vol. 35(1): (Jan. 2000).

(Continued)

*Primary Examiner*—Lincoln Donovan
*Assistant Examiner*—William Hernandez
(74) *Attorney, Agent, or Firm*—Hamilton, Brook, Smith & Reynolds, P.C.

(57) ABSTRACT

A charge pump for use in a Phase Locked Loop/Delay Locked Loop minimizes static phase error through the use of an operational amplifier. The operational amplifier also mitigates the effects of low power supply voltage.

24 Claims, 9 Drawing Sheets

U.S. PATENT DOCUMENTS

| | | |
|---|---|---|
| 6,603,340 B2 | 8/2003 | Tachimori |
| 6,617,936 B2 | 9/2003 | Dally et al. |
| 6,636,098 B1 | 10/2003 | Kizer |
| 6,664,829 B1 | 12/2003 | Hughes |
| 6,667,641 B1 | 12/2003 | Kim et al. |
| 6,710,665 B2 | 3/2004 | Maneatis |
| 6,741,110 B2 | 5/2004 | Roisen |
| 6,744,277 B1 | 6/2004 | Chang et al. |
| 6,744,292 B2 | 6/2004 | Chen et al. |
| 6,771,114 B2 | 8/2004 | Watarai |
| 6,829,318 B2 | 12/2004 | Kawahara |
| 6,861,916 B2 | 3/2005 | Dally et al. |
| 6,924,992 B2 | 8/2005 | Gaudin et al. |
| 6,954,511 B2 | 10/2005 | Tachimori |
| 7,092,689 B1 | 8/2006 | Boecker et al. |
| 7,167,037 B2 | 1/2007 | Rodgers et al. |
| 7,382,849 B1 | 6/2008 | Groe et al. |
| 2002/0041196 A1 | 4/2002 | Demone et al. |
| 2003/0076142 A1 | 4/2003 | Ko |
| 2004/0057546 A1 | 3/2004 | Badets et al. |
| 2005/0083090 A1 | 4/2005 | Moraveji |

FOREIGN PATENT DOCUMENTS

| | | |
|---|---|---|
| EP | 0 755 120 A1 | 1/1997 |
| EP | 1 292 033 A1 | 3/2003 |
| JP | 11-008553 | 1/1999 |
| JP | 2003-087115 | 3/2003 |
| KR | 1019990080026 A | 11/1999 |
| KR | 1020010110928 A | 12/2001 |
| KR | 20030051976 A | 6/2003 |
| KR | 20010057036 A | 7/2004 |

OTHER PUBLICATIONS

Mancatis, J.G., "Low-Jitter Process-Independent DLL and PLL Based on Self-Biased Techniques," *IEEE Journal of Solid-State Circuits*, vol. 31(11) (Nov. 1996).

Kim, C.H., et al., "A 64-Mbit, 640-Mbyte/s Bidirectional Data Strobed, Double-Data-Rate SDRAM with a 40-mW DLL for a 256-Mbyte Memory System," *IEEE Journal of Solid-State Circuits*, vol. 33(11): (Nov. 1998).

Moon, Y., et al., "An All-Analog Multiphase Delay-Locked Loop Using a Replica Delay Line for Wide-Range Operation and Low-Jitter Performance," *IEEE Journal of Solid-State Circuits*, vol. 35(3): (Mar. 2000).

Larsson, P., "A 2-1600MHz 1.2-2.5V CMOS Clock-Recovery PLL with Feedback Phase-Selection and Averaging Phase-Interpolation for Jitter Reduction," *IEEE Journal of Solid-State Circuits Conference*, (1999).

Lee, J-S., et al., "Charge Pump with Perfect Current Matching Characteristics in Phase-locked Loops," *Electronic Letters, IEE Stevenage*, GB, 36(23):1907-1908 (Nov. 2002).

International Search Report from EP 04 80 2287 dated Apr. 26, 2007.

US 6,642,753, 11/2003, Choi (withdrawn)

CHARGE PUMP FOR PLL/DLL

RELATED APPLICATIONS

This application is continuation of U.S. application Ser. No. 12/317,877, filed Dec. 30, 2008, now U.S. Pat. No. 7,692, 461 which is a continuation of U.S. application Ser. No. 12/214,053 (now issued as U.S. Pat. No. 7,616,035), filed Jun. 16, 2008, which is a continuation of U.S. application Ser. No. 11/636,876 (now issued as U.S. Pat. No. 7,408,391), filed Dec. 11, 2006, which is a continuation of U.S. application Ser. No. 11/009,534 (now issued as U.S. Pat. No. 7,176,733), filed Dec. 10, 2004, which claims the benefit of U.S. Provisional Application No. 60/528,958, filed on Dec. 11, 2003.

The entire teachings of the above applications are incorporated herein by reference.

BACKGROUND OF THE INVENTION

A Delay Locked Loop (DLL) with an adjustable delay line is used to synchronize a first clock signal with a second clock signal by delaying the first clock signal. The DLL includes a phase detector, which detects the phase difference between the first clock signal and the second clock signal. Based on the detected phase difference, the DLL synchronizes the first clock signal to the second clock signal by adding an appropriate delay to the first clock signal until the second clock signal is in phase with the first clock signal.

FIG. 1 is a block diagram of a prior art DLL 100. An externally supplied clock (CLK) is buffered by clock buffer 101 to provide a reference clock (CLK_REF) that is coupled to a voltage controlled delay line 102 and a phase detector 104. The voltage controlled delay line 102 produces an output clock (CLK_OUT), which is a delayed version of CLK_REF and is routed to various circuits within the device and to the replica delay circuit 103. The replica delay circuit 103 provides a delay similar to the delay through buffer 101 and wire routing delays. Replica delays, otherwise known as delay model circuits, are well-known to those skilled in the art. See U.S. Pat. No. 5,796,673 to Foss et al. for further explanation of replica delays. A feedback clock signal CLK_FB output from the replica delay circuit 103 is coupled to the phase detector 104. Other prior art DLLs use a digital tapped delay line. Commonly owned U.S. Pat. Nos. 5,796,673 and 6,087, 868 describe such types of DLLs.

The phase detector 104 generates phase control signals (UP, DOWN) dependent on the phase difference between CLK_REF and CLK_FB. The UP signal is set to a logic '1' on first receipt of a CLK_REF rising edge and the DOWN signal is set to a logic '1' on first receipt of a CLK_FB rising edge. Both UP and DOWN signals are reset to logic '0' when the subsequent rising edge of the two signals is received. Thus, when the CLK_REF rising edge is detected before the CLK_FB rising edge, the UP signal transitions to a logic '1' to increase the delay in the voltage controlled delay line (VCDL) 102 until the next rising edge of the CLK_FB is detected. Alternatively, if CLK_FB rising edge is detected prior to the CLK_REF rising edge, the DOWN signal transitions to a logic '1' to decrease the delay until the next rising edge of CLK_REF is detected.

The phase control signals (UP/DOWN) of the phase detector 104 are integrated by a charge pump 105 and a loop filter 106 to provide a variable bias voltage $V_{CTRL}$ 110. The bias voltage $V_{CTRL}$ selects the delay to be added to CLK_REF by the VCDL 102 to synchronize CLK_FB with CLK_REF.

FIG. 2 is a schematic of a prior art charge pump 200 that can be used in the prior art DLL shown in FIG. 1. Referring to the DLL system shown in FIG. 1, the response of the DLL is determined in part by the ability to precisely control the control voltage $V_{CTRL}$ which controls the voltage control delay 102 (FIG. 1) in the DLL. This is turn is determined by how precisely current can be added to or drained from the OUT node of the charge pump 200.

The voltage at the OUT node of the charge pump 200 is dependent on the phase control signals (UP/DOWN) received from the phase detector 104 (FIG. 1). To decrease the delay, the DOWN signal and ENABLE signal are both asserted (logic '1') which results in a logic '1' at the gate of transistor 217 turning transistor 217 'on'. With transistor 215 already 'on', current (pull-down current) flows from node OUT to ground through transistor 215 and transistor 217. This pull-down current drains the charge from the OUT node, causing the voltage at the OUT node to decrease.

To increase the delay, the UP signal and the ENABLE signal are both asserted (logic '1') which results in a logic '0' at the gate of transistor 209, turning transistor 209 'on'. With both transistor 209 'on' and transistor 210 'on', current flows from $V_{dd}$ through transistor 209 and transistor 210 to the OUT node. This current flows through the loop filter 106 (FIG. 1) and adds charge to node OUT. The added charge increases the voltage at the OUT node.

The charge pump 200 includes two current mirrors labeled M1, M2 that control the magnitude of the current provided to the OUT node of the charge pump 200. Current mirror M1 includes master transistor 214 and slave transistors 210 and 212 and controls the pull-up current flowing from $V_{dd}$ through transistor 210. Current mirror M2 includes master transistor 216 and slave transistor 215. Transistor 216 takes the current from transistor 212 in current mirror M1 and mirrors it in transistor 215 to provide the pull-down current through transistor 215 to ground.

While the DLL is in lock condition, the phase detector 104 (FIG. 1) typically asserts its UP and DOWN signals for equal durations on every clock cycle. Thus, the charge pump 200 will receive both UP and DOWN signals asserted for an equal period of time in order to maintain the same voltage at the node OUT. In order to provide zero static phase offset at the output of the DLL when both the UP and DOWN signals of the phase comparator are asserted for equal durations, the charge pump must produce the same current pulses at the output OUT (node OUT) so that the current pulses cancel out and no net charge change is delivered to the loop filter 106 (FIG. 1).

Thus, in order to minimize the static phase error, the drain/source currents through transistor 210 and transistor 215 should be matched as closely as possible. Ideally the magnitudes of the currents through transistors 210 in current mirror M1 and transistor 215 in current mirror M2 are identical. The current matching is performed by mirroring the current from device 212 into device 210 and down to device 215 via current mirror M2.

However, the voltage at node OUT may not be the same as the voltage at node 'ctrl'. This voltage difference results in the drain-source voltage of bias transistor 216 in current mirror M2 being different from the drain-source voltage of transistor 215. The same is true for transistor 212 and transistor 210 with respect to the drain-source voltage of bias transistor 214 in current mirror M1. A change in the source-drain voltage leads to a change in the drain current especially if transistors 215 and 210 have low output impedance. This results in a different drain/source current flowing through the devices in each current mirror, which finally results in a current difference between transistor 210 and transistor 215. The difference in current between transistor 215 and transistor 210 can be as large as about 20% which results in a significant static phase error when the DLL is in lock condition. In the embodiment shown, the static phase error increases as technologies become smaller because the output impedance of transistors becomes smaller.

The DLL static phase error is understood as a constantly occurring phase difference between CLK_REF and CLK_FB when the DLL is in lock condition, and the charge supplied to node OUT through transistor 210 is equal to the charge drained from node OUT through transistor 215 during every clock cycle. Thus, the phase detector detects that the clock signals are perfectly aligned and does not vary the voltage level at node OUT.

FIG. 3 is a graph that illustrates source and sink current in the prior art DLL shown in FIG. 2 prior to lock condition. Trace 150 corresponds to the source current through transistor 210 in FIG. 2 and trace 152 corresponds to the sink current through transistor 215 in FIG. 2. Prior to lock condition, the source current and the sink currents are not equal, with the source current being greater than the sink current. In lock condition, the areas below each of the traces 150, 152 will be the same. Thus, when the currents are not equal, the DLL compensates with a phase error, or "static phase error" in order to maintain the same charge in the node OUT. The phase error results from the signal with a lower current being wider in time than the signal with the higher current so that the areas are substantially equal. Although the falling edge of each of the traces 150, 152 will occur at about the same time, the rising edges will occur at different times to compensate for the non-equal source and sink current. Therefore the phase error is present by the inherent design of the prior art DLL.

In submicron technologies (i.e., 0.13 microns and smaller) the output impedance of a transistor decreases as the channel length shrinks, so the transistors do not meet the requirements for the output impedance required for an output transistor of a charge pump. One known method of increasing the output impedance of the charge pump in order to minimize static phase error is through the use of a cascode current source. However, a cascode current source does not fit well with the trend of power supply voltage decrease. For example, with power supply voltage of 1V and typical threshold voltage of 0.25V to 0.3V, a 1V power supply voltage is too low to sustain two cascode current sources (each having two threshold voltages) in series.

SUMMARY OF THE INVENTION

The static phase error in a charge pump is minimized through the use of an active current source. The active current mirror also mitigates the effects of low power supply voltage. According to an embodiment of the invention, a charge pump includes a pull-up circuit, a pull-down circuit and an operational amplifier. The pull-up circuit supplies a pull-up current to increase voltage at the charge pump output. The pull-down circuit supplies a pull-down current to decrease voltage at the charge pump output. The operational amplifier has a first input and a second input. The first input is coupled to the charge pump output and the second input coupled to a drain of a transistor that supplies current to the pull-down circuit. The operational amplifier output is coupled to the transistor and the pull-down circuit. The operational amplifier adjusts the voltage level at the operational amplifier output so that the voltage difference between the operational amplifier inputs is minimized and the difference between the pull-down current and the pull-up current is decreased.

The charge pump may also include a startup circuit coupled to the first input of the operational amplifier which sets the voltage at the first input to a voltage level below the power supply voltage during power-up of the charge pump. In an embodiment of the present invention, the power supply voltage supplied to the charge pump may be about one volt.

The pull-up circuit includes a first PMOS device and a second PMOS device. The drain of the first PMOS device is coupled to the source of the second PMOS device, the source of the first PMOS device is coupled to the power supply voltage node (or rail) and the drain of the second PMOS device is coupled to the charge pump output. The pull-up circuit supplies pull-up current while the first PMOS device is on.

The pull-down circuit includes a first NMOS device and a second NMOS device. The drain of the first NMOS device is coupled to the source of the second NMOS device, the source of the first NMOS device is coupled to ground and the drain of the second NMOS device coupled to the charge pump output. The pull-down circuit supplies pull-down current while the first NMOS device is on.

The charge pump also includes a reference current source which supplies current to the pull-down circuit and the pull-up circuit. In one embodiment, the reference current source includes a programmable array of transistors. The operational amplifier may be a low power rail to rail input, rail to rail output operational amplifier.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

A description of example embodiments of the invention follows.

Figure 4:
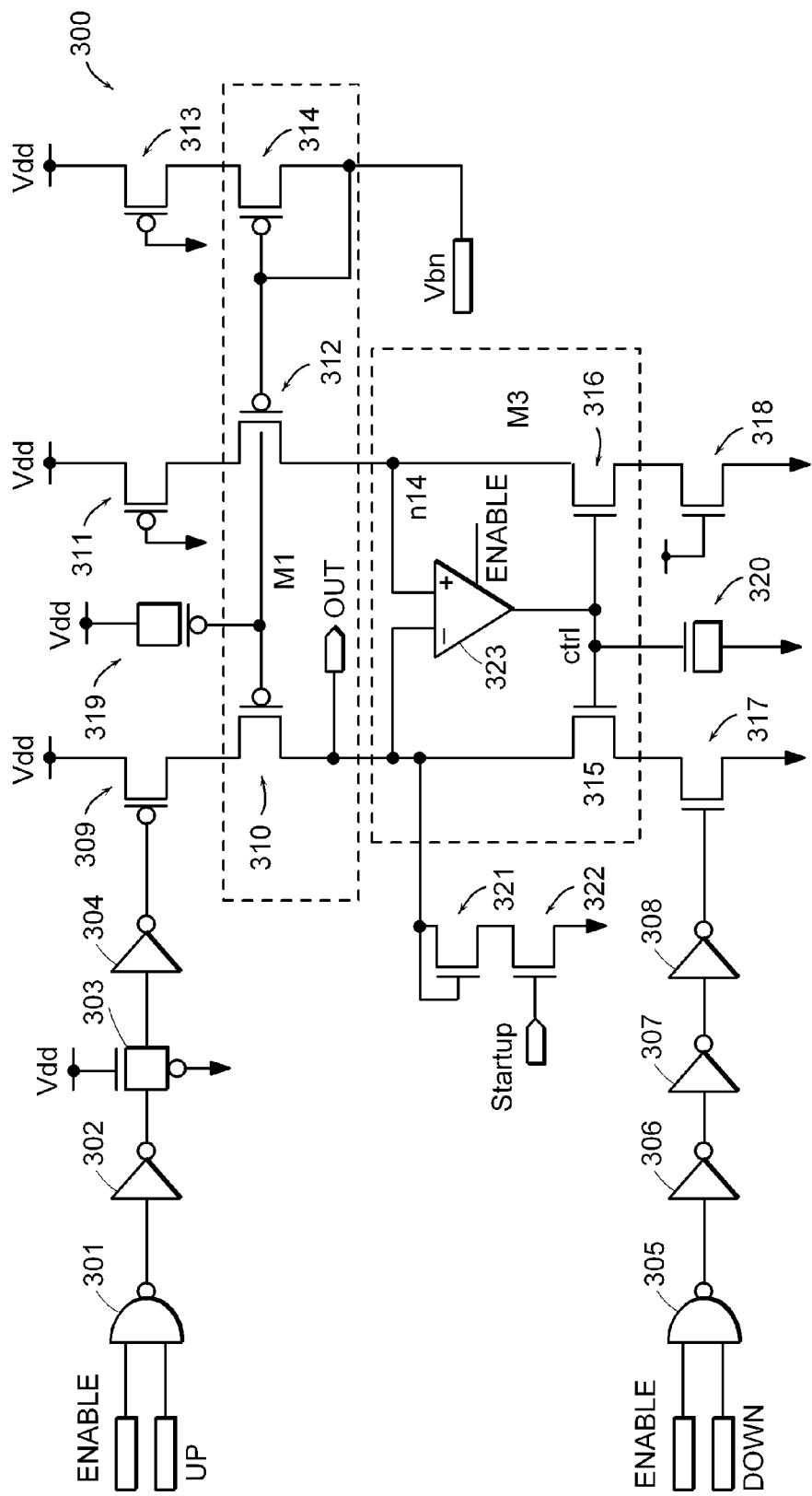
FIG. 4 is a schematic of a charge pump according to the principles of the present invention.

FIG. 4 is a schematic of a charge pump 300 according to the principles of the present invention. The charge pump 300 includes a plurality of transistors. In the embodiment shown, the transistors are metal-oxide semiconductor ("MOS") transistors, also referred to as field effect transistors ("FET"). As is well-known to those skilled in the art, there are two types of MOS transistors: n-channel MOS transistors (NMOS) and p-channel MOS transistors (PMOS). The charge pump 300 includes both NMOS and PMOS transistors. The PMOS transistors are graphically illustrated with a circle at the gate The charge pump 300 includes current mirror M1 and active current mirror M3. Current mirror M1 is similar to the current mirror M1 described in conjunction with the prior art charge pump 200 shown in FIG. 2. The active current mirror M3 includes an operational amplifier ("op amp") 323 which minimizes static phase error by actively making the voltage on node "OUT" substantially equal to the voltage on node 'ctrl' to minimize the difference between the output (drain) current (charge-pump pull-down current) of transistor 315 and the output (drain) current (charge pump pull-up current) of transistor 310.

Current mirror M1 includes bias PMOS transistor 314 and NMOS transistors 310 and 312. Voltage $V_{bn}$ sets the bias voltage for current mirror M1 and sets the current that flows through PMOS transistor 314. PMOS transistors 314 and 313 provide a reference current source which supplies current to a pull-down circuit and a pull-up circuit. The current through PMOS transistor 314 is mirrored in PMOS transistors 312 and 310. The current that flows through each transistor in a current mirror can be modified by varying the sizes (width/length ratios) of these devices as is well-known to those skilled in the art.

PMOS device 314 in current mirror M1 provides the initial current to the charge pump dependent on the voltage provided by bias voltage $V_{bn}$ at the node of the source-drain connection of PMOS device 314. When the charge pump is used in a DLL system, the bias voltage adjusts the maximum current of the charge pump according to the total delay of the delay chain so that the ratio between the reference frequency and DLL bandwidth stays constant.

The gate of PMOS transistor 314 is coupled to the drain of PMOS transistor 314. The gates of PMOS devices 312 and 310 are coupled to the gate of PMOS device 314 allowing this initial current to be mirrored to PMOS transistors 312 and 310. The drain of NMOS device 316 is coupled to the drain of PMOS device 312. Thus, the current mirrored to PMOS device 312 is the same current provided to NMOS device 316 in current mirror M3. The gate of NMOS device 316 is coupled to the gate of NMOS device 315, allowing the drain current of NMOS device 316 to be mirrored to NMOS device 315 in current mirror M3 to provide the pull-down current.

Figure 1:
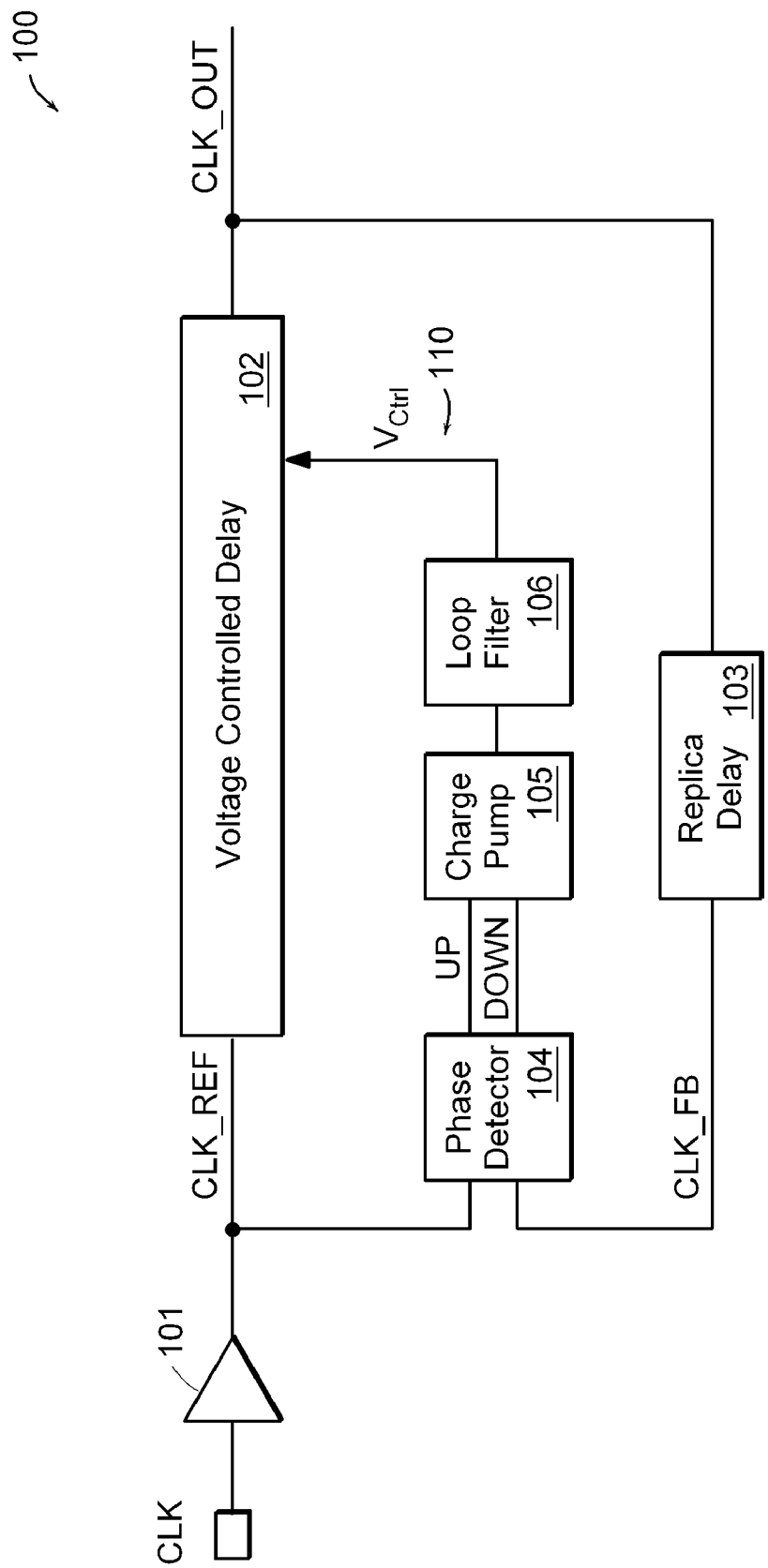
FIG. 1 is a block diagram of a prior art Delay Locked Loop.

Generally, when the charge pump is enabled (signal ENABLE is asserted or driven to a logic 1) and signal UP is asserted, transistor 309 is turned 'on' by the voltage applied to the gate of transistor 309 through NAND gate 301, inverters 302 and 304 and pass gate 303. This allows current to flow through PMOS transistors 309 and 310 in the pull-up circuit. This current adds charge into the OUT node which is coupled to the loop filter 206 (FIG. 1). This increase in charge while transistor 309 is 'on' results in an increase in voltage at node OUT, which when the charge pump 300 replaces the charge pump 105 shown in the prior art DLL 100 shown in FIG. 1 causes an increase in the delay generated by the voltage controlled delay line 102. Similarly, when the charge pump is enabled (ENABLE high) and signal DOWN is asserted, transistor 317 is turned 'on' by the voltage applied to the gate through NAND gate 305 and inverters 306, 307 and 308. This allows current to flow through transistors 315 and 317 in the pull-down circuit. This current flow from node OUT to ground through transistors 315, 317 takes charge away from node OUT. This reduction in charge while transistor 315 is 'on' results in a decrease in voltage at node OUT and a decrease in the delay generated by the voltage controlled delay line 102 (FIG. 1).

The paths from the UP/DOWN signals at the input of NAND gates 302, 304 through inverters 303, 304 and through inverters 307, 308 to the gate of transistors 310, 315 are matched to provide the same insertion delay. The pass gate 303 is included in the path to replicate the delay added by inverter 307 in the path from the DOWN signal to the gate of transistor 317. To compensate for the small voltage drop across the source drain path of NMOS transistor 309 when transistor 309 is 'on', PMOS transistors 311 and 313 are added to provide symmetry with the current path through PMOS transistor 309. NMOS transistor 318 provides symmetry with the current path through PMOS transistor 315.

Current mirror M3 controls the ratio between pull-down current (through NMOS transistor 315 to ground) and pull up current (from $V_{dd}$ through PMOS transistor 310). The pull-down current reduces the voltage at node OUT and the pull-up current increases the voltage at node OUT. Thus, the M1 current mirror sets the maximum current of the charge pump through PMOS device 310 and the M3 current mirror controls the ratio between the pull up and pull down current. Current mirrors M1 and M3 may be adjustable or programmable through the use of well-known techniques. Transistors 315 and 316 in current mirror M3 may be sized to deliver more or less current. This allows the circuit designer to compensate for other factors such as parasitic resistances and capacitances and parameter variations. However, such adjustments are static and cannot be re-adjusted once the chip has been packaged and it cannot compensate for voltage change at the OUT node.

According to one embodiment of the invention, an active adjustment of the current mirrors is provided through the use of an operational amplifier, as shown in FIG. 4. The inverting input of the operational amplifier 323 in active current mirror M3 is coupled to node OUT and the non-inverting input of operational amplifier 323 is coupled to node 'n14'. The output node of the operational amplifier 323 is coupled to node 'ctrl' and the gates of NMOS devices 315, 316. Operational amplifier 323 adjusts the voltage on the control node 'ctrl', if there is any voltage difference between nodes OUT and 'n14'. A change in voltage on control node 'ctrl' results in a corresponding change in voltage on node OUT and node 'n14' through NMOS devices 315, 316.

During operation of the charge pump, the operational amplifier 323 minimizes the static phase error by actively keeping the voltage on node 'n14' substantially equal to the output voltage on node OUT. It is important to be able to produce the same pull-up and pull-down current pulses at the output ("OUT") when the DLL is in lock condition. In a DLL which has achieved lock condition, node OUT is not actively being charged or discharged most of the time as the UP and DOWN pulses are of equal duration. Furthermore, the UP and DOWN pulses can be of shorter duration than in the prior art charge pump described in conjunction with FIG. 2 resulting in a reduction of power required in the device. Thus, the voltage at node OUT remains substantially constant. Changes in voltage at node 'ctrl' result in a corresponding change in the currents flowing in NMOS transistors 315, 316. However, the change in voltage at node 'ctrl' affects node 'n14' more quickly than node OUT because the capacitance of node 'n14' is smaller than the capacitance present at node OUT.

The operational amplifier 323 actively controls the voltage at node OUT as follows: if the voltage on node 'n14' is higher than the voltage at node OUT, the operational amplifier 323 increases the voltage at node 'ctrl'. The increase in voltage at node 'ctrl' results in an increase in the current flowing through NMOS transistor 316 and NMOS transistor 315 which reduces the voltage on node 'n14' until it is the same as the voltage at node OUT. If the voltage on node 'n14' is less than the voltage on node OUT, the operational amplifier 323 decreases the voltage on node 'ctrl'. This decrease in the voltage on node 'ctrl' results in a decrease in the current flowing in NMOS transistor 316 and NMOS transistor 315. As the voltage at node 'ctrl' changes the voltage on node 'n14' faster than on node OUT, a new balance point is reached with the voltage on node 'n14' equal to the voltage on node OUT. With the voltage on node 'n14' and the output voltage OUT being substantially the same, the source/drain current (pull-down current) through NMOS device 315 is substantially equal to the source/drain current (pull-up current) through PMOS device 310.

Figure 2:
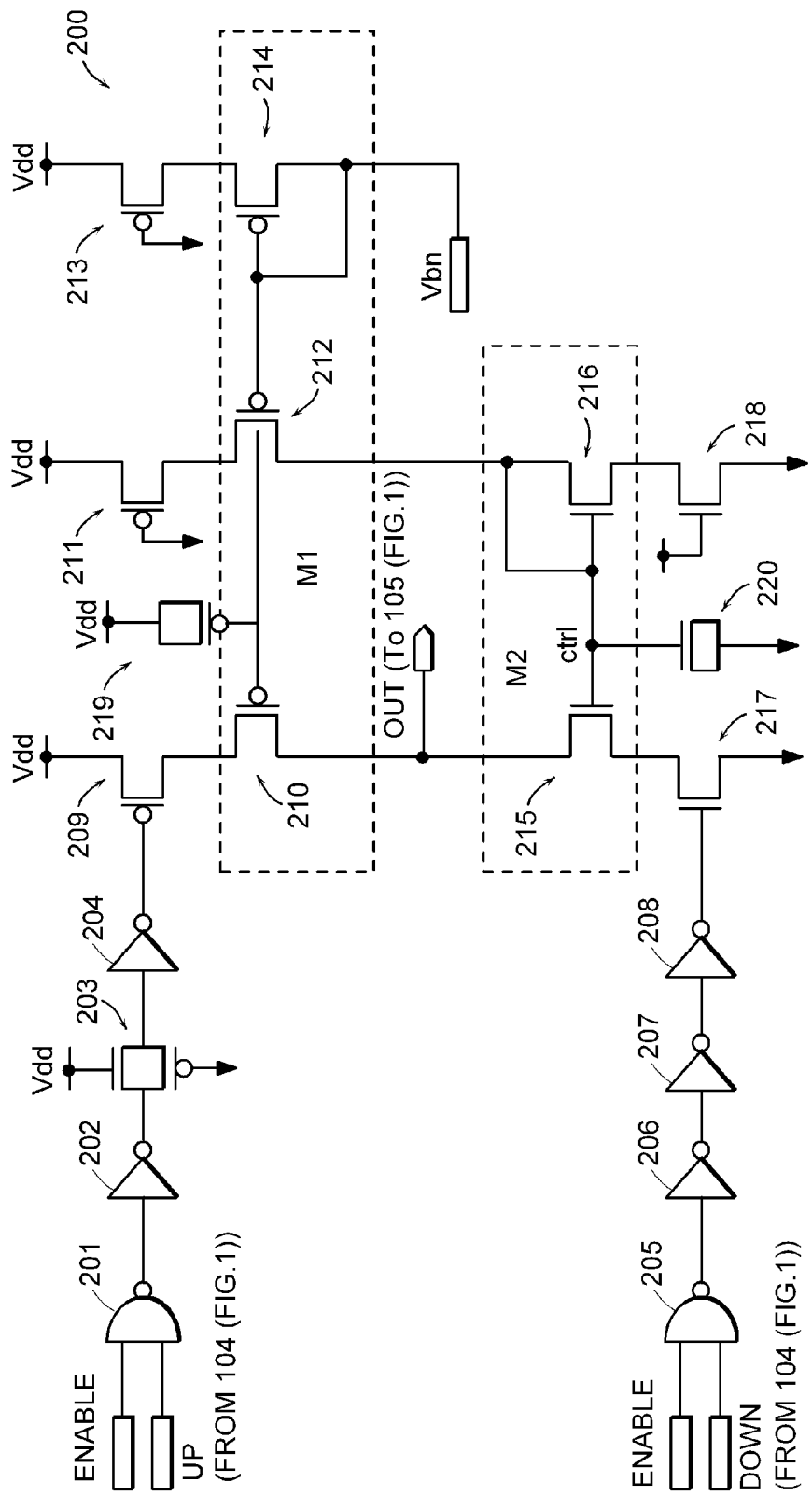
FIG. 2 is a schematic of a prior art charge pump that can be used in the prior art DLL shown in FIG. 1.
Figure 3:
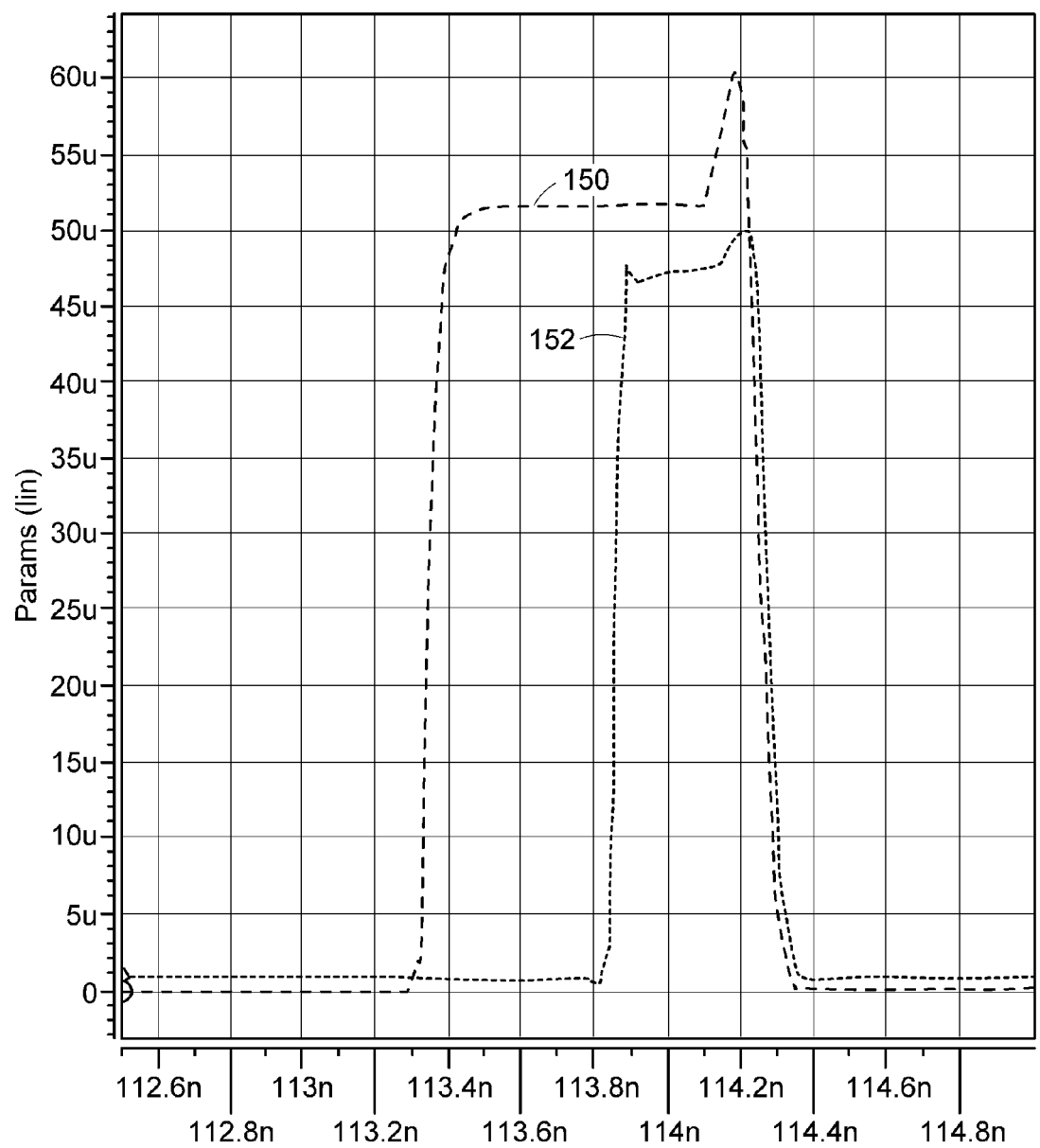
FIG. 3 is a graph that illustrates source and sink current in the prior art DLL shown in FIG. 2 prior to lock condition.

By providing an active current mirror including an operational amplifier to the charge pump, the voltage conditions at drain, source and gate of NMOS transistors pair 315 and 316 and PMOS transistors pair 312 and 310 are substantially equal and much closer than in the prior art circuit shown in FIG. 2, resulting in a very accurate matching current through NMOS transistor 315 and PMOS transistor 310. Transistors 319 and 320 are simple buffer capacitances, which prevent the noise caused by NMOS device 315 and PMOS device 310 to couple into the respective bias nodes of the current mirrors M1, M2.

Figure 9:
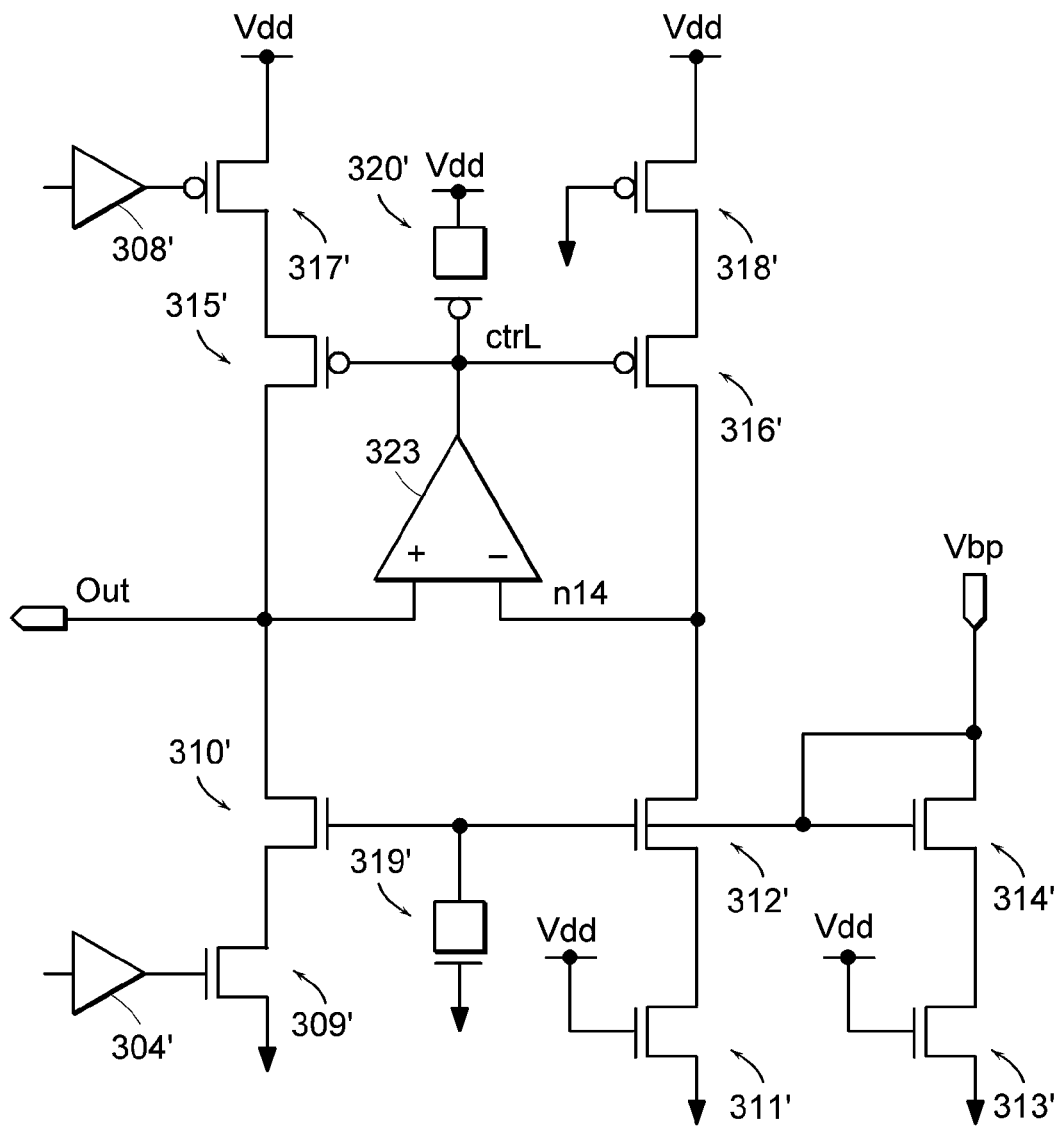
FIG. 9 is a schematic illustrating another embodiment of the charge pump having a different configuration with the operational amplifier controlling P-MOS devices instead of the NMOS transistors as shown in the embodiment of FIG. 4.

The operational amplifier 323 preferably has an input range from rail to rail (Vdd to Vss (ground)). In an embodiment in which transistors 315, 316 are NMOS devices as shown in FIG. 4, the required output range is from Vdd down to a predetermined voltage close to above ground, i.e. one threshold voltage of an NMOS transistor above ground (Vtn). This output voltage range ensures that NMOS transistors 315 and 316 can never be fully turned 'off', as this would make the circuit inoperable. In an alternate embodiment in which transistors 315, 316 are PMOS devices as shown in FIG. 9, the required output range is from Vss to Vtp (i.e., one threshold voltage of a PMOS transistor below Vdd). Thus, an operational amplifier 323 with a rail to rail output range is preferred].

During the power up phase, if the voltage at node 'n14' is lower than the voltage at node OUT, the output of the operational amplifier, that is, node 'ctrl' is driven low. As node 'ctrl' is coupled to the gate of NMOS device 315, NMOS device 315 will likely turn 'off'. The circuit may freeze in this state or may take a long time to recover. Either case is undesirable.

A start up circuit including NMOS device 321 and NMOS device 322 assists the charge pump in reaching its operating point during the power up phase. The start up circuit initially sets the voltage of node OUT to a value less than $V_{dd}$. This allows the operational amplifier 323 to operate properly after the power up phase. A startup signal that is asserted for a predetermined time period after power up during the power up phase is coupled to the gate of NMOS device 322. NMOS device 322 is diode coupled with both the gate and source coupled to the node OUT. The drain of NMOS device 322 is coupled to the drain of NMOS device 322.

While the startup signal coupled to the drain of NMOS device 321 is asserted, the NMOS device 322 is 'on'. Node OUT is approximately equal to $V_{dd}$, thus, with both NMOS device 321 and NMOS device 322 'on', current flows through NMOS device 321 and NMOS device 322 resulting in a decrease in the voltage at node OUT.

Thus, the startup circuit ensures that the voltage at node OUT is less than the voltage at node 'n14' during the power up phase, so that the differential input voltage to the operational amplifier 323 is initially positive and node 'ctrl' at the output of the operational amplifier 323 is driven 'high' during the startup phase holding NMOS device 315 is on. This forces node OUT to approximately the threshold voltage of an NMOS transistor for this predetermined time period. After the power up phase, the startup signal is de-asserted and the startup circuit is no longer required to be enabled.

The present invention reduces the current offset, i.e. the difference in currents flowing between NMOS transistor 315 and PMOS transistor 310 to about 4%. This results in a highly reduced static phase error for the overall DLL system. By reducing the current offset of the charge pump from 20% to 4% in this embodiment, the overall static phase error of the PLL/DLL is reduced from 300 ps to 60 ps.

Figure 5:
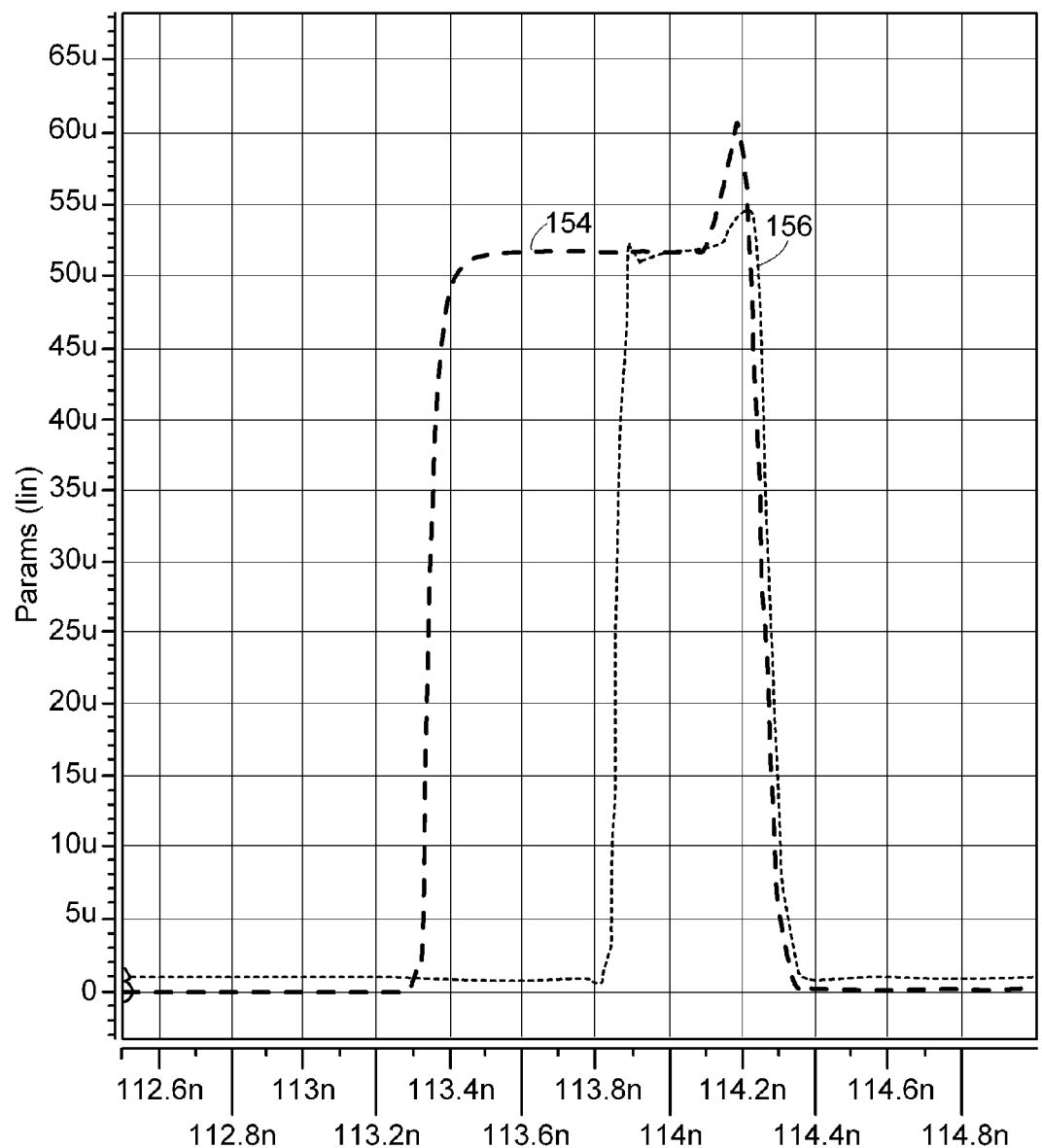
FIG. 5 is a graph that illustrates the source and sink current pulses in the charge pump shown in FIG. 4 prior to lock condition.

FIG. 5 is a graph that illustrates the source and sink current pulses in the charge pump shown in FIG. 4 prior to lock condition. In this example, trace 154 corresponds to the source current through transistor 309 in FIG. 4 and trace 156 corresponds to the sink current through transistor 317 in FIG. 4. In the embodiment according to the present invention, the source current and the sink currents are substantially equal in magnitude. Since FIG. 5 illustrates the pulses prior to lock condition, the DLL will start changing the voltage in the node OUT, in order to have the edges of the source and the sink pulses aligned, in search for the lock condition. When the lock condition is reached, the areas below each of the traces 154, 156 will be the same resulting in a stable level of voltage at node OUT. When the source and sink currents are substantially equal in magnitude, the alignment of the edges of the pulses is more accurate, eliminating one of the largest components contributing to static phase error.

Figure 6:
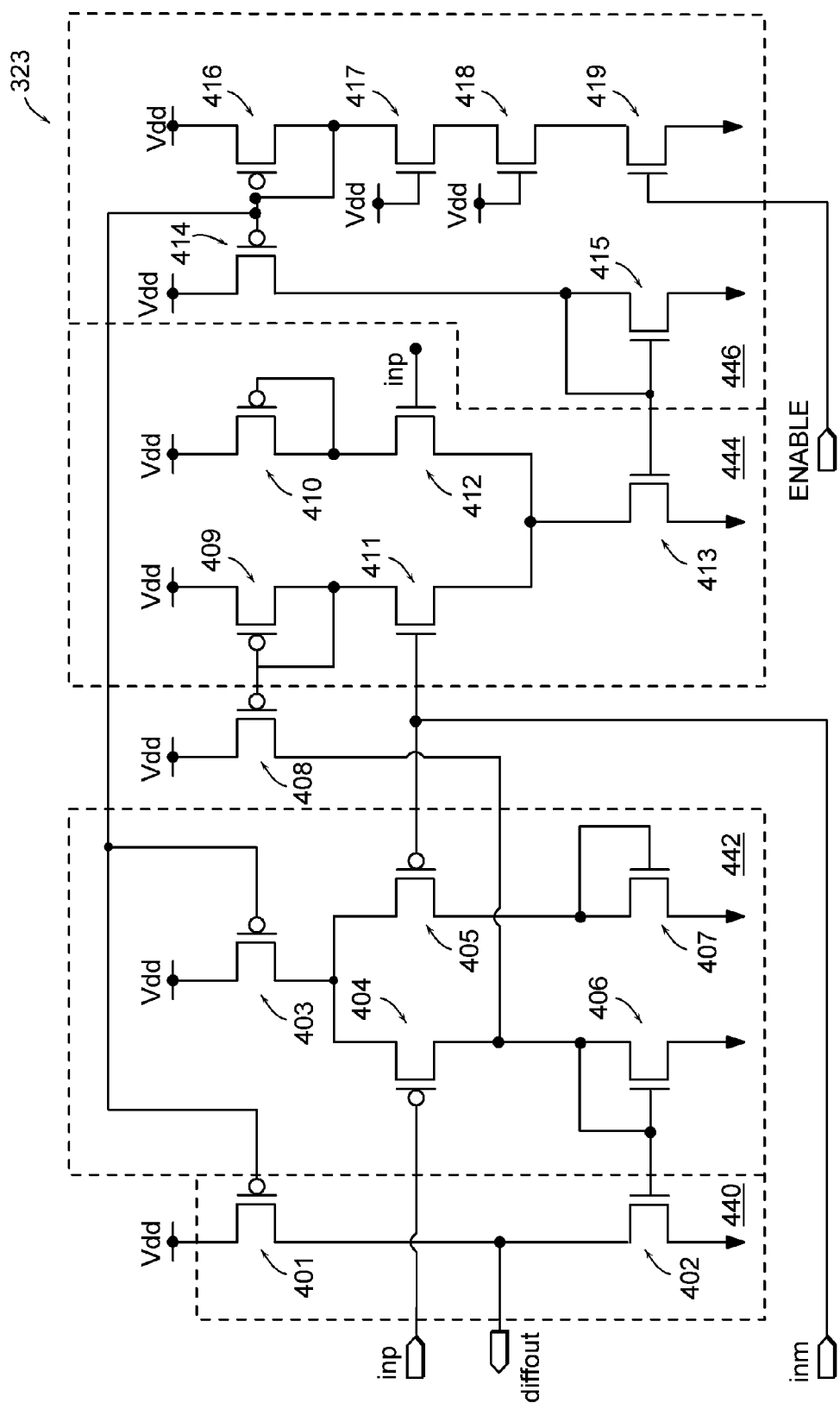
FIG. 6 is a schematic of the operational amplifier shown in FIG. 4.

FIG. 6 is a schematic of an embodiment of the operational amplifier 323 shown in FIG. 4. The operational amplifier based on complementary input pairs that operate at very low voltage. In the embodiment shown, the operational amplifier can operate with 1V total power supply voltage from Vdd to Vss with Vss assumed to be about 0V (connected to ground).

The operational amplifier 323 includes two differential amplifiers 442, 444, a biasing circuit 446 and an output stage 440. The differential amplifiers 442, 444 have complementary input pairs with the first differential amplifier having an NMOS transistor input pair 411, 412 and the second differential amplifier having a PMOS transistor input pair 404, 405. The first differential amplifier 442 also includes transistors PMOS transistor 403 and NMOS transistors 406, 407. The second differential amplifier 444 also includes PMOS transistors 409, 410, and NMOS transistor 413.

The output stage 440 includes transistors 401 and 402. The biasing circuit includes transistors 414, 415, 416, 417, 418 and 419 and provides bias voltages to transistor 401 in the output stage 440, transistor 403 in the first differential amplifier 442 and transistor 413 in the second differential amplifier 444.

Node OUT shown in FIG. 4 is coupled to differential input 'inm' of each differential amplifier and node 'n14' shown in FIG. 4 is coupled to differential input 'inp' of each differential amplifier. The output stage of the operational amplifier 'diff_out' is coupled to node 'ctrl' shown in FIG. 4.

When the charge pump 300 (FIG. 4) is enabled (signal ENABLE is asserted or driven to logic 1), transistor 419 is turned on allowing current to flow through transistors 416, 417, 418 and 419. The current in transistor 409 in the second differential amplifier 444 is mirrored in transistor 408. Transistor 408 provides the output of the second differential amplifier. The current from transistor 404 (representing the output of the first differential amplifier) and transistor 408 (representing the output of the second differential amplifier)

is summed in transistor 406 in the first differential amplifier 440 and mirrored to transistor 402 in the output stage. When the charge pump 300 is disabled (signal ENABLE is de-asserted or driven to a logic 0), due to the logic 0 at the gate of transistor 419, transistor 419 is off and the operational amplifier does not modify the voltage on the ctrl node.

Figure 7:
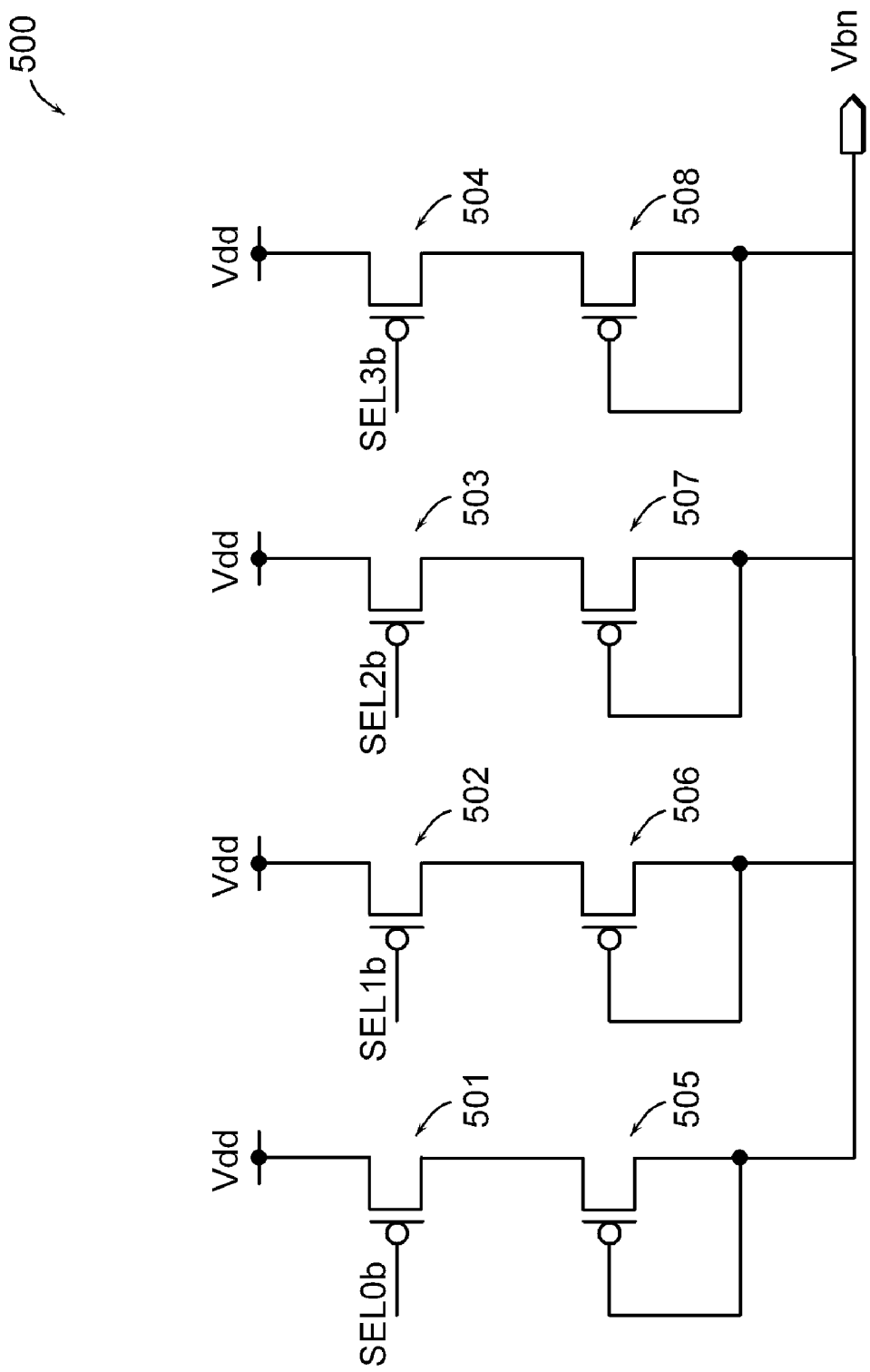
FIG. 7 is a schematic of a programmable array of transistors that can be used in the charge pump of FIG. 4.

Other embodiments can use programmable arrayed master transistors for the reference current source in the current mirrors to configure or test the operation of the circuit. FIG. 7 is a schematic 500 of such a programmable array of transistors suitable to replace both transistor 313 and transistor 314 of FIG. 4. Four active low select signals (SEL0$b$, SEL1$b$, SEL2$b$ and SEL3$b$) are coupled to four select PMOS transistors 501, 502, 503 and 504. Each select transistor is coupled to a different current mirror master PMOS transistor 505, 506, 507, 508. One or more of the SEL signals is active low, which allows a variable current to flow. The magnitude of the current varies dependent on the number of SEL signals that are active low. For example, with only SEL0$b$ active low, current only flows through PMOS transistor 505 and select transistor 501 and this current is mirrored in transistors 312 and 310 in FIG. 4. The magnitude of the current is increased with all four select signals active low, as current flows through PMOS transistors 505, 506, 507 and 508 and all of the select transistors. This current is mirrored in transistors 312 and 310 through the $V_{bn}$ node which is coupled to the drains of transistors 310 and 312.

The SEL signals can be controlled by a register, fuse programming, mask programming or any other technique well-known to those skilled in the art. While four sets of programmable master transistors are shown, any number can be used. A similar circuit using NMOS transistors may be used to add programmability by replacing both transistors 416 and 418 of FIG. 4 with a programmable array of transistors.

The invention is not limited to charge pumps used in DLLs. For example, the invention can also be used in a charge pump in a phase locked loop. A Phase-Locked Loop (PLL) is another well-known circuit for synchronizing a first clock signal with a second clock signal.

Figure 8:
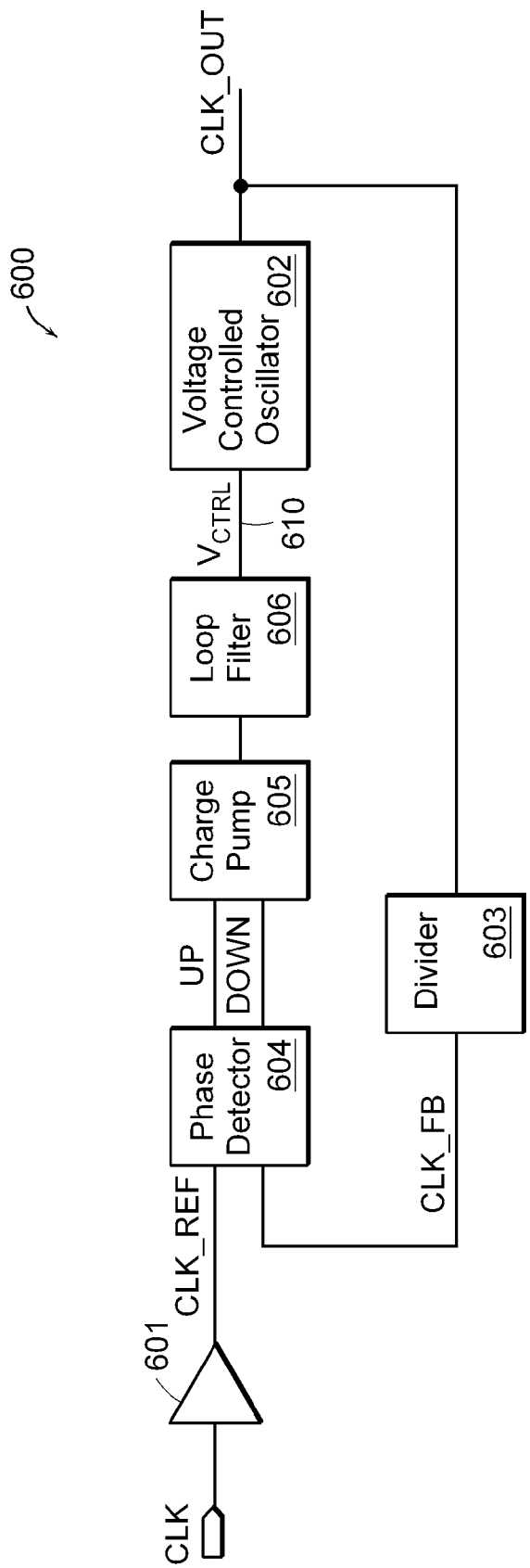
FIG. 8 is a block diagram of a prior art Phase Locked Loop in which the charge pump can be used.

FIG. 8 is a block diagram of a prior art PLL 600. An externally supplied clock (CLK) is buffered by clock buffer 601 to provide a reference clock (CLK_REF) that is coupled to a phase detector 604. The phase detector 604 generates phase control signals (UP, DOWN) dependent on the phase difference between CLK_REF and CLK_FB.

The phase control signals (UP/DOWN) of the phase detector 604 are integrated by a charge pump 605 and a loop filter 606 to provide a variable bias voltage $V_{CTRL}$ 110. The bias voltage $V_{CTRL}$ controls a voltage controlled oscillator (VCO) 602 which outputs a clock signal CLK_OUT. The frequency of the output clock signal CLK_OUT is proportional to the bias voltage $V_{CTRL}$ 610. VCOs are well known to those skilled in the art.

The CLK_OUT signal is optionally coupled to a divider 603 to produce a feedback clock signal CLK_FB. If the phase detector detects the rising edge of CLK_REF prior to the rising edge of CLK_FB it asserts the UP signal which causes $V_{CTRL}$ to increase, thereby increasing the frequency of the CLK_OUT signal. If the phase detector detects the rising edge of CLK_FB prior to the rising edge of CLK_REF it asserts the DOWN signal which causes $V_{CTRL}$ to decrease, thereby decreasing the frequency of the CLK_OUT signal.

FIG. 9 is a schematic of another embodiment of the charge pump having a different configuration with the operational amplifier controlling P-MOS devices instead of the NMOS transistors as shown in the embodiment of FIG. 4. By applying the same principle of the invention, the operational amplifier 323 equalizes the drains of transistors 310', 312', 315, and 316' in the same way as described in conjunction with the embodiment shown in FIG. 4.

This invention has been described for use in a charge pump in a PLL/DLL system. However, the invention is not limited to a PLL/DLL system. The invention can be used in any system in which a very precise current mirror is required and where the output voltage of the current mirror does not reach ground, which would render the op amp in the active current mirror inoperable.

While this invention has been particularly shown and described with references to preferred embodiments thereof, it will be understood by those skilled in the art that various changes in form and details may be made therein without departing from the scope of the invention encompassed by the appended claims.

What is claimed is:

1. A charge pump comprising:
   pull-up circuitry that comprises a current source and a controlled transistor having a gate adapted for connection to a first input signal for being controlled thereby, the pull-up circuitry connected between a positive voltage supply and a charge pump output node;
   pull-down circuitry that comprises a current source and a controlled transistor having a gate adapted for connection to a second input signal for being controlled thereby, the pull-down circuitry connected between a ground voltage supply and the charge pump output node, the first and second input signals being derived from up and down signals, respectively;
   a reference current source for controlling a current in the current sources of the pull-up and pull-down circuitries;
   an operational amplifier having two inputs and an output, the operational amplifier configured to reduce phase error, one of the inputs of the operational amplifier connected to the charge pump output node;
   a startup circuit to establish a predetermined voltage level at the charge pump output node during startup; and
   a capacitor connected to the charge pump output node.

2. The charge pump of claim 1 wherein the current sources in each of the pull-up circuitry and the pull-down circuitry comprises a transistor connected in series with the respective controlled transistor.

3. The charge pump of claim 2 wherein the controlled transistor in the pull-up circuitry is connected to the positive voltage supply, and the current source transistor in the pull-up circuitry is connected to the charge pump output node.

4. The charge pump of claim 2 wherein the controlled transistor in the pull-down circuitry is connected to the ground voltage supply, and the current source transistor in the pull-down circuitry is connected to the charge pump output node.

5. The charge pump of claim 1 further comprising additional pull-up circuitry and additional pull-down circuitry connected together at an additional node.

6. The charge pump of claim 5 wherein the additional pull-up circuitry and the pull-up circuitry have corresponding transistors with source and drain terminals connected in the same manner, and the additional pull-down circuitry and the pull-down circuitry have corresponding transistors with source and drain terminals connected in the same manner.

7. The charge pump of claim 6 wherein a gate of a controlled transistor in the additional pull-up circuitry is connected to a first voltage supply, and a gate of a controlled transistor in the additional pull-down circuitry is connected to a second voltage supply.

8. The charge pump of claim 6 wherein the additional pull-up circuitry and the pull-up circuitry have correspondingly same sized transistors, and the additional pull-down circuitry and the pull-down circuitry have correspondingly same sized transistors.

9. The charge pump of claim 5 wherein the other input of the operational amplifier is connected to the additional node.

10. The charge pump of claim 9 wherein the output of the operational amplifier is connected to a selected one of the current source of the pull-down circuitry and the current source of the pull-up circuitry, and the reference current source is connected to the current source of the other circuitry.

11. The charge pump of claim 1 wherein the operational amplifier has an output range substantially from rail to rail.

12. The charge pump of claim 1 wherein the operational amplifier comprises two differential input stages.

13. The charge pump of claim 12 wherein the differential input stages comprise one PMOS input differential stage and one NMOS input differential stage.

14. The charge pump of claim 1 wherein the startup circuit comprises a MOS device having a source connected to a voltage supply and a gate connected to a startup control signal.

15. The charge pump of claim 14 wherein the MOS device is an NMOS device.

16. The charge pump of claim 14 wherein the voltage supply is the ground voltage supply.

17. The charge pump of claim 14 wherein the startup circuit further comprises a source follower transistor that is connected in series with the MOS device.

18. The charge pump of claim 17 wherein the voltage supply is the ground voltage supply and the source follower transistor is connected to the charge pump output node.

19. The charge pump of claim 1 further comprising a voltage controlled oscillator connected to the charge pump output node in a phase locked loop configuration.

20. The charge pump of claim 1 further comprising a voltage controlled delay line connected to the charge pump output node in a delay locked loop configuration.

21. A charge pump comprising:
pull-up circuitry that comprises a current source and a controlled transistor having a gate adapted for connection to a first input signal for being controlled thereby, the pull-up circuitry connected between a positive voltage supply and a charge pump output node;
pull-down circuitry that comprises a current source and a controlled transistor having a gate adapted for connection to a second input signal for being controlled thereby, the pull-down circuitry connected between a ground voltage supply and the charge pump output node, the first and second input signals being derived from up and down signals, respectively;
a reference current source;
a plurality of programmable transistors, both the reference current source and the plurality of programmable transistors each configured to control the current in at least one of the current sources of the pull-up and pull-down circuitries;
a capacitor connected to the charge pump output node; and
a startup circuit connected to the charge pump output node, the startup circuit comprising a MOS device having a source connected to a voltage supply and a gate connected to a startup control signal.

22. The charge pump of claim 21 wherein the voltage supply is the ground voltage supply.

23. The charge pump of claim 21 wherein the startup circuit further comprises a source follower transistor that is connected in series with the MOS device.

24. The charge pump of claim 21 wherein the voltage supply is the ground voltage supply and the source follower transistor is connected to the charge pump output node.

* * * * *

UNITED STATES PATENT AND TRADEMARK OFFICE
CERTIFICATE OF CORRECTION

PATENT NO. : 7,893,737 B2  
APPLICATION NO. : 12/714670  
DATED : February 22, 2011  
INVENTOR(S) : Dieter Haerle It is certified that error appears in the above-identified patent and that said Letters Patent is hereby corrected as shown below:

In the Claims

Claim 24, Column 12, Line 33, is to be amended by deleting the word "the" and adding the word a. Claim 24 should read as follows:

24. The charge pump of claim 21 wherein the voltage supply is the ground voltage supply and a source follower transistor is connected to the charge pump output node.

Signed and Sealed this  
Twenty-fourth Day of May, 2016

Michelle K. Lee  
*Director of the United States Patent and Trademark Office*